United States Patent
Jo et al.

(10) Patent No.: US 12,021,494 B2
(45) Date of Patent: Jun. 25, 2024

(54) MULTIPLEXER

(71) Applicant: Nippon Telegraph and Telephone Corporation, Tokyo (JP)

(72) Inventors: Teruo Jo, Tokyo (JP); Munehiko Nagatani, Tokyo (JP); Hideyuki Nosaka, Tokyo (JP)

(73) Assignee: NIPPON TELEGRAPH AND TELEPHONE CORPORATION, Tokyo (JP)

( * ) Notice: Subject to any disclaimer, the term of this patent is extended or adjusted under 35 U.S.C. 154(b) by 6 days.

(21) Appl. No.: 18/002,919

(22) PCT Filed: Jun. 26, 2020

(86) PCT No.: PCT/JP2020/025274
§ 371 (c)(1),
(2) Date: Dec. 22, 2022

(87) PCT Pub. No.: WO2021/260927
PCT Pub. Date: Dec. 30, 2021

(65) Prior Publication Data
US 2023/0246616 A1  Aug. 3, 2023

(51) Int. Cl.
*H03F 3/60*  (2006.01)
*H03H 11/34*  (2006.01)

(52) U.S. Cl.
CPC ............ *H03F 3/605* (2013.01); *H03H 11/34* (2013.01)

(58) Field of Classification Search
CPC ................ H03F 3/605; H03H 11/34

USPC ............................. 327/355; 330/54, 286, 295
See application file for complete search history.

(56) References Cited

U.S. PATENT DOCUMENTS

| | | | |
|---|---|---|---|
| 5,365,197 A | * | 11/1994 | Ikalainen ............... H03F 3/607 333/22 R |
| 2001/0002803 A1 | | 6/2001 | Sato |
| 2003/0011436 A1 | | 1/2003 | Shigematsu |
| 2006/0279360 A1 | * | 12/2006 | Shigematsu .......... H03F 3/3001 330/286 |

FOREIGN PATENT DOCUMENTS

| | | |
|---|---|---|
| JP | 10112626 A | 4/1998 |
| JP | 2003092523 A | 3/2003 |

* cited by examiner

*Primary Examiner* — William Hernandez
(74) *Attorney, Agent, or Firm* — Slater Matsil, LLP

(57) ABSTRACT

An embodiment is a multiplexer including a first distributed amplifier with an impedance matched to 50Ω, the first distributed amplifier configured to receive a first signal and output a first amplified signal, a second distributed amplifier with an impedance matched to 50Ω, the second distributed amplifier configured to receive a second signal and output a second amplified signal, and a passive multiplexer configured to multiplex the first amplified signal and the second amplified signal, and output a multiplexed signal to a signal output terminal, the passive multiplexer including a first resistor having a first end to receive the first amplified signal, a second resistor having a first end to receive the second amplified signal, and a third resistor having a first end connected to second ends of the first and second resistors and a second end connected to the signal output terminal.

12 Claims, 10 Drawing Sheets

MULTIPLEXER

This patent application is a national phase filing under section 371 of PCT/JP2020/025274, filed Jun. 26, 2020, which is incorporated herein by reference in its entirety.

TECHNICAL FIELD

The present invention relates to circuit techniques for handling high frequency electrical signals, and particularly to multiplexers.

BACKGROUND

Wideband active multiplexers are desired in various systems such as systems for high-speed communication and high-resolution radars. Distributed active multiplexers have been proposed as a technique to widen the bandwidth of active multiplexers (See Patent Literature 1). FIG. 9 illustrates the configuration of a conventional distributed active multiplexer. The distributed active multiplexer includes an input transmission line 100 having an input end connected to a signal input terminal 101, an input transmission line 102 having an input end connected to a signal input terminal 103, an output transmission line 104 having a terminal end connected to a signal output terminal 105, an input termination resistor R100 having a first end connected to a terminal end of the input transmission line 100 and a second end connected to the ground, an input termination resistor R101 having a first end connected to a terminal end of the input transmission line 102 and a second end connected to the ground, an output termination resistor R102 having a first end connected to an input end of the output transmission line 104 and a second end connected to the ground, a plurality of unit amplifiers 105 arranged along the input transmission line 100 and the output transmission line 104, each of the unit amplifiers 105 having an input terminal connected to the input transmission line 100 and an output terminal connected to the output transmission line 104, and a plurality of unit amplifiers 106 arranged along the input transmission line 102 and the output transmission line 104, each of the unit amplifiers 106 having an input terminal connected to the input transmission line 102 and an output terminal connected to the output transmission line 104.

The input transmission line 100 includes a plurality of transmission lines CPW100i, CPW100, and CPW1000 connected in series. The input transmission line 102 includes a plurality of transmission lines CPW102i, CPW102, and CPW1020 connected in series. The output transmission line CPW104 includes a plurality of transmission lines CPW104i, CPW104, and CPW1040 connected in series.

The input signal to channel 1 is inputted to each of the unit amplifiers 105 while being transmitted through the input transmission line 100. Similarly, the input signal to channel 2 is inputted to each of the unit amplifiers 106 while being transmitted through the input transmission line 102. The outputs of the unit amplifiers 105 and 106 on the channel 1 side and the channel 2 side are connected to the same output transmission line 104. The output signals from the unit amplifiers 105 and 106 are transmitted through a common output transmission line 104 and outputted to the signal output terminal 105.

To connect the input and output transmission lines 100, 102, and 104 to external devices, impedances of those lines with the parasitic capacitance of the transistors in the unit amplifiers 105 and 106 incorporated need to be matched to 50Ω. Hereinafter, a transmission line including the parasitic capacitance of the transistors is called a pseudo transmission line to distinguish it from general transmission lines.

In general, an impedance Z of a lossless pseudo transmission line is expressed by the following expression, in which LLine and CLine are the inductance component and the capacitance component of a transmission line per unit length, Cpara is the parasitic capacitance component of the transistors connected to the transmission line.

[Math. 1]

$$Z = \sqrt{\frac{L_{Line}}{C_{Line} + C_{para}}} \quad (1)$$

The parasitic capacitance component Cpara is different at the input and at the output of a unit amplifier. For this reason, the impedance of the input transmission line needs to be designed to be 50Ω by adjusting the inductance component LLine and the capacitance component CLine of the input transmission line in consideration of the parasitic capacitance component Cpara on the input side of the unit amplifier. The impedance of the out transmission line needs to be designed to be 50Ω by adjusting the inductance component LLine and the capacitance component CLine of the output transmission line in consideration of the parasitic capacitance component Cpara on the output side of the unit amplifier. The phase velocity V of a pseudo transmission line is expresses by the following expression.

[Math. 2]

$$V = \frac{1}{\sqrt{L_{Line}(C_{Line} + C_{para})}} \quad (2)$$

The phase velocities of the input transmission line and the output transmission line are matched to make it possible to multiplex signals in a wide bandwidth. In addition, a pseudo transmission line, unlike a general transmission line, has a cutoff frequency f expressed by the following expression. This cutoff frequency f determines the bandwidth of the distributed active multiplexer.

[Math. 3]

$$f = \frac{1}{\pi \sqrt{L_{line}(C_{Line} + C_{para})}} \quad (3)$$

However, in a conventional active multiplexer, an output transmission line is shared by channel 1 and channel 2, and thus, the parasitic capacitance of two unit amplifiers is connected to the output transmission line per unit length, resulting in a problem that the bandwidth is narrow. The cutoff frequency fcut of an output pseudo transmission line is expressed by the following expression, in which CTr is the parasitic capacitance of one unit amplifier.

[Math. 4]

$$f_{cut} = \frac{1}{\pi \sqrt{L_{Line}(C_{Line} + 2C_{Tr})}} \quad (4)$$

Another problem of a conventional distributed active multiplexer is that the isolation between input channels is low. The reason why the isolation is low is that as illustrated in FIG. 10, signals are coupled between the unit amplifier 105 on the channel 1 side and the unit amplifier 106 on the channel 2 side via the parasitic capacitances C100 and C101 existing between the input and output terminals of the unit amplifiers 105 and 106.

CITATION LIST

Non-Patent Literature

Non-Patent Literature 1: Paolo Valerio Testa, Corrado Carta, and Frank Ellinger, "Analysis and design of a 220-GHz wideband SiGe BiCMOS distributed active combiner", IEEE Transactions on Microwave Theory and Techniques, VOL. 64, NO. 10, PP. 3049-3059, 2016

SUMMARY

Technical Problem

The embodiments of the present invention has been made to solve the above problems, and an object thereof is to provide a multiplexer having a wide bandwidth and improved isolation between input channels.

Means for Solving the Problem

An embodiment of a multiplexer of the present invention includes: a first distributed amplifier that receives input of a first signal and an impedance of which is matched to 50Ω; a second distributed amplifier that receives input of a second signal and an impedance of which is matched to 50Ω; and a passive multiplexer that multiplexes an output signal of the first distributed amplifier and an output signal of the second distributed amplifier, in which the passive multiplexer includes a first resistor having a first end connected to an output of the first distributed amplifier, a second resistor having a first end connected to an output of the second distributed amplifier, and a third resistor having a first end connected to second ends of the first and second resistors and a second end connected to a signal output terminal, and resistance values of the first, second, and third resistors are 16.7Ω.

Effects of the Invention

Since embodiments of the present invention includes the passive multiplexer that multiplexes the output signals of the first and second distributed amplifiers the impedances of which are matched to 50Ω, and the passive multiplexer includes three 16.7Ω resistors, it is possible to achieve a wider bandwidth and improved isolation between the input channels.

DETAILED DESCRIPTION OF ILLUSTRATIVE EMBODIMENTS

First Embodiment

Figure 1:
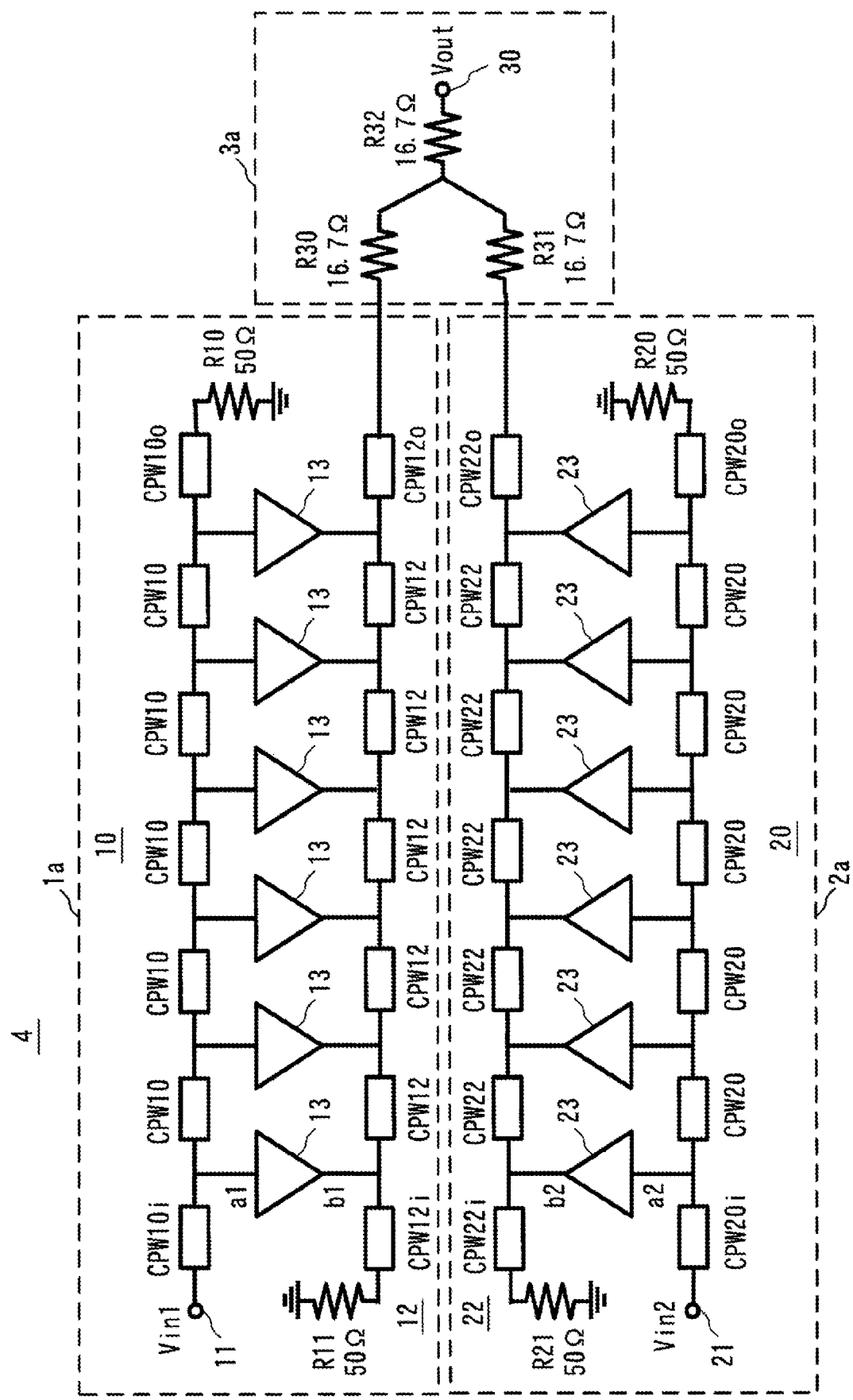
FIG. 1 is a circuit diagram illustrating the configuration of a multiplexer according to a first embodiment of the present invention.

Hereinafter, embodiments of the present invention will be described with reference to the drawings. FIG. 1 is a circuit diagram illustrating the configuration of a multiplexer according to a first embodiment of the present invention. The multiplexer 4 in the present embodiment includes a distributed amplifier 1a that receives input of a channel 1 signal Vin1 and an impedance of which is matched to 50Ω, a distributed amplifier 2a that receives input of a channel 2 signal Vin2 and an impedance of which is matched to 50Ω, and a passive multiplexer 3a that multiplexes the output signal of the distributed amplifier 1a and the output signal of the distributed amplifier 2a.

The distributed amplifier 1a includes an input transmission line 10 having an input end connected to a signal input terminal 11 for channel 1 of the multiplexer 4, an output transmission line 12 having a terminal end that outputs the channel 1 signal, an input termination resistor R10 having a first end connected to the terminal end of the input transmission line 10 and a second end connected to the ground, an output termination resistor R11 having a first end connected to the input end of the output transmission line 12 and a second end connected to the ground, and a plurality of unit amplifiers 13 arranged along the input transmission line 10 and the output transmission line 12, each of the unit amplifiers 13 having an input terminal a1 connected to the input transmission line 10 and an output terminal b1 connected to the output transmission line 12. Resistance values of the input termination resistor R10 and the output termination resistor R11 are 50Ω.

The input transmission line 10 includes a plurality of transmission lines CPW10$i$, CPW10, and CPW100 connected in series. The transmission line CPW10 between unit amplifiers and the transmission line CPW10$i$ on the input side have different characteristic impedances. The reason is that the transmission line CPW10$i$ needs to absorb the effects of the parasitic capacitance of the circuit and the like in the previous stage of the signal input terminal 11. Similarly, the transmission lines CPW10 and CPW100 have different characteristic impedances. The reason is that the transmission line CPW100 needs to absorb the effects of the parasitic capacitance of the input termination resistor R10. The characteristic impedance of the input pseudo transmission line including the input transmission line 10 and the parasitic capacitance of the transistors in the unit amplifiers 13 is designed to be 50Ω.

The output transmission line 12 includes a plurality of transmission lines CPW12$i$, CPW12, and CPW120 connected in series. The transmission line CPW12 between unit amplifiers and the transmission line CPW12$i$ on the input side have different characteristic impedances. The reason is that the transmission line CPW12$i$ needs to absorb the effects of the parasitic capacitance of the output termination resistor R11. Similarly, the transmission lines CPW12 and CPW120 have different characteristic impedances. The reason is that the transmission line CPW120 needs to absorb the effects of the parasitic capacitance of the passive multiplexer 3$a$ in the subsequent stage. The characteristic impedance of the output pseudo transmission line including the output transmission line 12 and the parasitic capacitance of the transistors in the unit amplifiers 13 is designed to be 50Ω.

The distributed amplifier 2$a$ includes an input transmission line 20 having an input end connected to a signal input terminal 21 for channel 2 of the multiplexer 4, an output transmission line 22 having a terminal end that outputs the channel 2 signal, an input termination resistor R20 having a first end connected to the terminal end of the input transmission line 20 and a second end connected to the ground, an output termination resistor R21 having a first end connected to the input end of the output transmission line 22 and a second end connected to the ground, and a plurality of unit amplifiers 23 arranged along the input transmission line 20 and the output transmission line 22, each of the unit amplifiers 23 having an input terminal a2 connected to the input transmission line 20 and an output terminal b2 connected to the output transmission line 22. Resistance values of the input termination resistor R20 and the output termination resistor R21 are 50Ω.

The input transmission line 20 includes a plurality of transmission lines CPW20$i$, CPW20, and CPW200 connected in series. The transmission line CPW20 between unit amplifiers and the transmission line CPW20$i$ on the input side have different characteristic impedances. The reason is that the transmission line CPW20$i$ needs to absorb the effects of the parasitic capacitance of the circuit and the like in the previous stage of the signal input terminal 21. Similarly, the transmission lines CPW20 and CPW200 have different characteristic impedances. The reason is that the transmission line CPW200 needs to absorb the effects of the parasitic capacitance of the input termination resistor R20. The characteristic impedance of the input pseudo transmission line including the input transmission line 20 and the parasitic capacitance of the transistors in the unit amplifiers 23 is designed to be 50Ω.

The output transmission line 22 includes a plurality of transmission lines CPW22$i$, CPW22, and CPW220 connected in series. The transmission line CPW22 between unit amplifiers and the transmission line CPW22$i$ on the input side have different characteristic impedances. The reason is that the transmission line CPW22$i$ needs to absorb the effects of the parasitic capacitance of the output termination resistor R21. Similarly, the transmission lines CPW22 and CPW220 have different characteristic impedances. The reason is that the transmission line CPW220 needs to absorb the effects of the parasitic capacitance of the passive multiplexer 3$a$ in the subsequent stage. The characteristic impedance of the output pseudo transmission line including the output transmission line 22 and the parasitic capacitance of the transistors in the unit amplifiers 23 is designed to be 50Ω.

The passive multiplexer 3$a$ includes a resistor R30 having a first end connected to the terminal end of the output transmission line 12 of the distributed amplifier 1$a$ (the output terminal of the distributed amplifier 1$a$), a resistor R31 having a first end connected to the terminal end of the output transmission line 22 of the distributed amplifier 2$a$ (the output terminal of the distributed amplifier 2$a$), and a resistor R32 having a first end connected to the second ends of the resistors R30 and R31 and a second end connected to a signal output terminal 30 of the multiplexer 4. Resistance values of the resistors R30 to R32 are 16.7Ω.

The configurations of the unit amplifiers 13 and 23 will be described later.

In the present invention, the output transmission line that is shared by channel 1 and channel 2 in the conventional technique is separated, the number of parasitic capacitances of the unit amplifiers connected the output transmission line per unit length is reduced to one, and this enables a wider bandwidth. The cutoff frequency fcut of the multiplexer 4 of the present embodiment is expressed by the following expression, in which LLine is the inductance component of the output transmission lines 12 and 22 per unit length, CLine is the capacitance component of the output transmission lines 12 and 22 per unit length, and CTr is the parasitic capacitance of one unit amplifier.

[Math. 5]

$$f_{cut} = \frac{1}{\pi\sqrt{L_{Line}(C_{Line} + C_{Tr})}} \tag{5}$$

In the present embodiment, the passive multiplexer 3$a$ is composed of three resistors R30 to R32, each resistance being 16.7Ω, and thus, the impedance of the passive multiplexer 3$a$ seen from the output of each of the two distributed amplifiers 1$a$ and 2$a$, and the impedance of the passive multiplexer 3$a$ seen from the signal output terminal 30 are all 50Ω. Thus, the present embodiment makes it possible to multiplex signals in a wide bandwidth without causing impedance mismatch.

In the present embodiment, the output transmission lines 12 and 22 are separate; thus, signals are not coupled between the unit amplifiers 13 of the channel 1 side and the unit amplifiers 23 on the channel 2 side. In addition, the output signals of the unit amplifiers 13 and 23 are attenuated by the resistors R30 to R32 of the passive multiplexer 3$a$. Thus, the present embodiment makes it possible to improve the isolation between channel 1 and channel 2.

Figure 2:
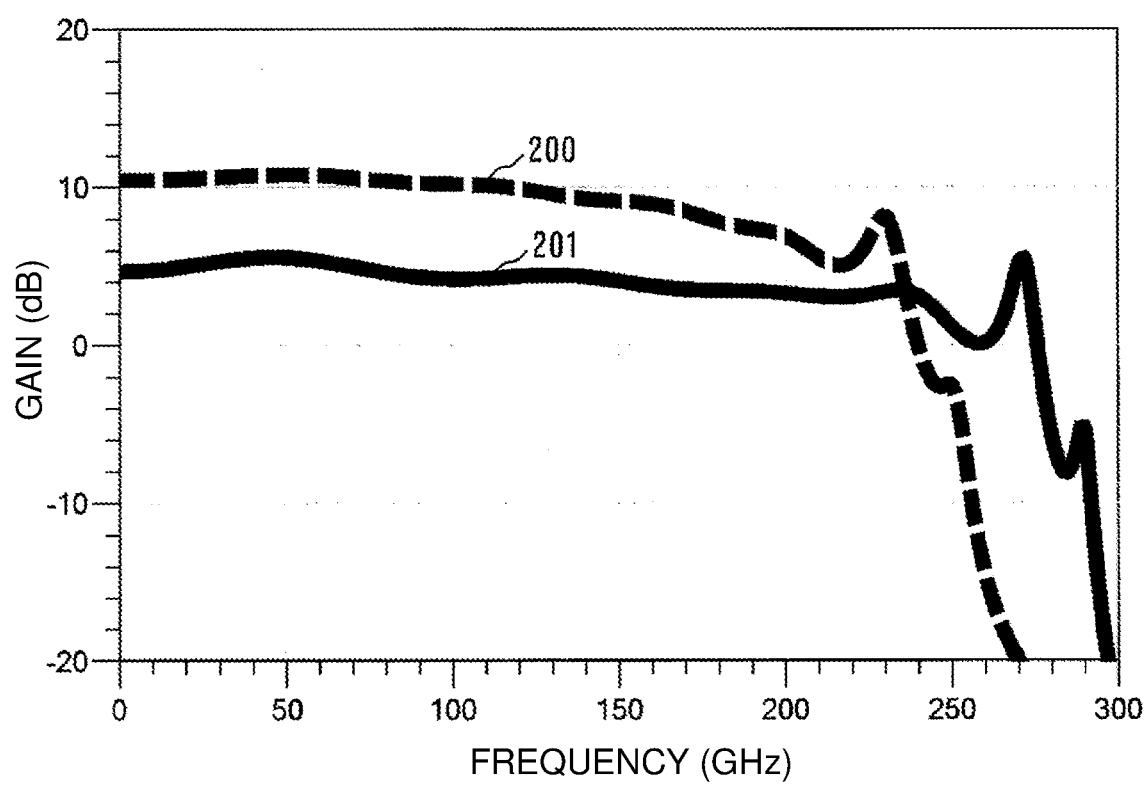
FIG. 2 is a graph showing simulation results of the transmission characteristics of a conventional distributed active multiplexer and the multiplexer according to the first embodiment of the present invention.
Figure 9:
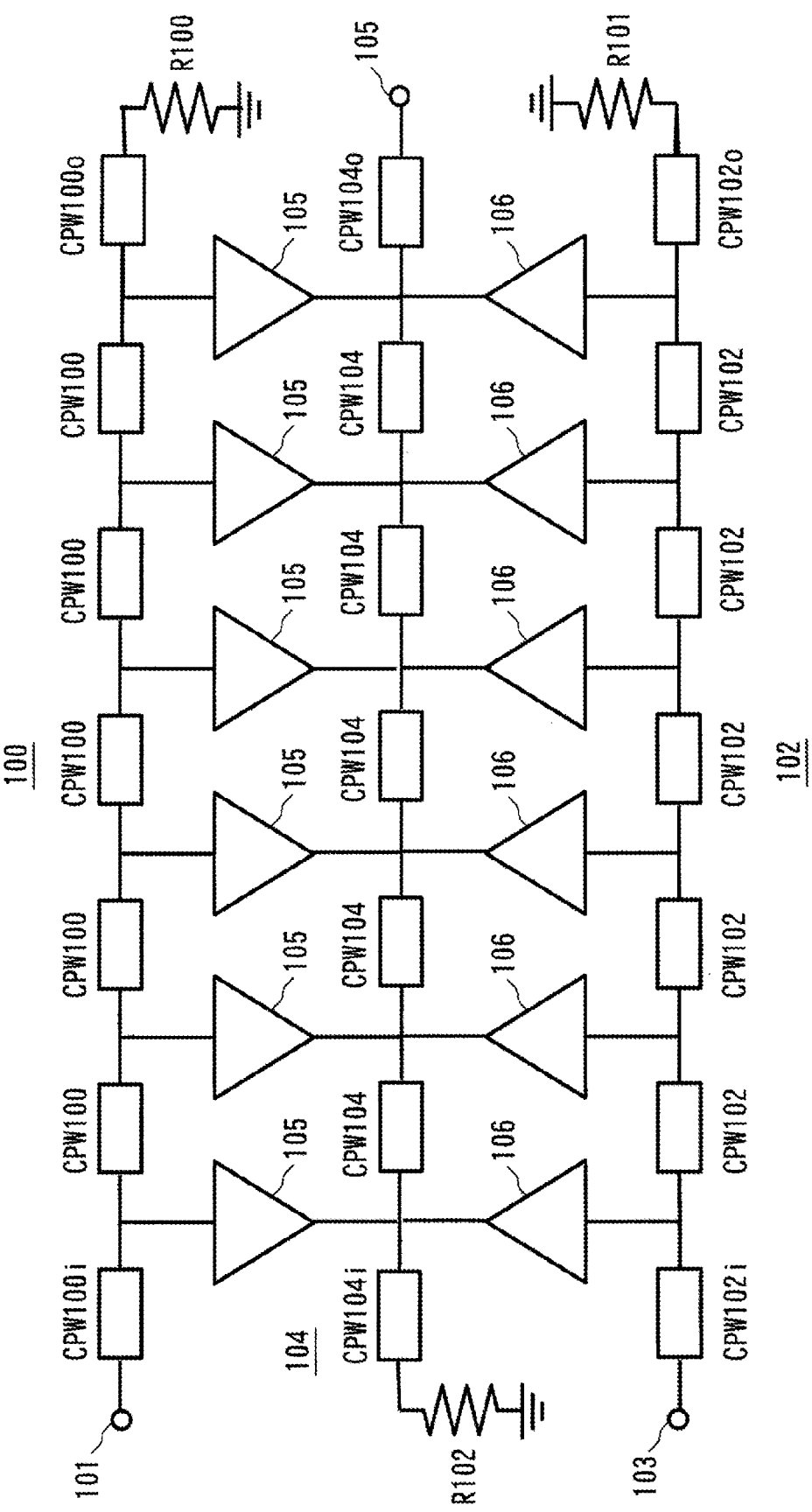
FIG. 9 is a circuit diagram illustrating the configuration of a conventional distributed active multiplexer.
Figure 10:
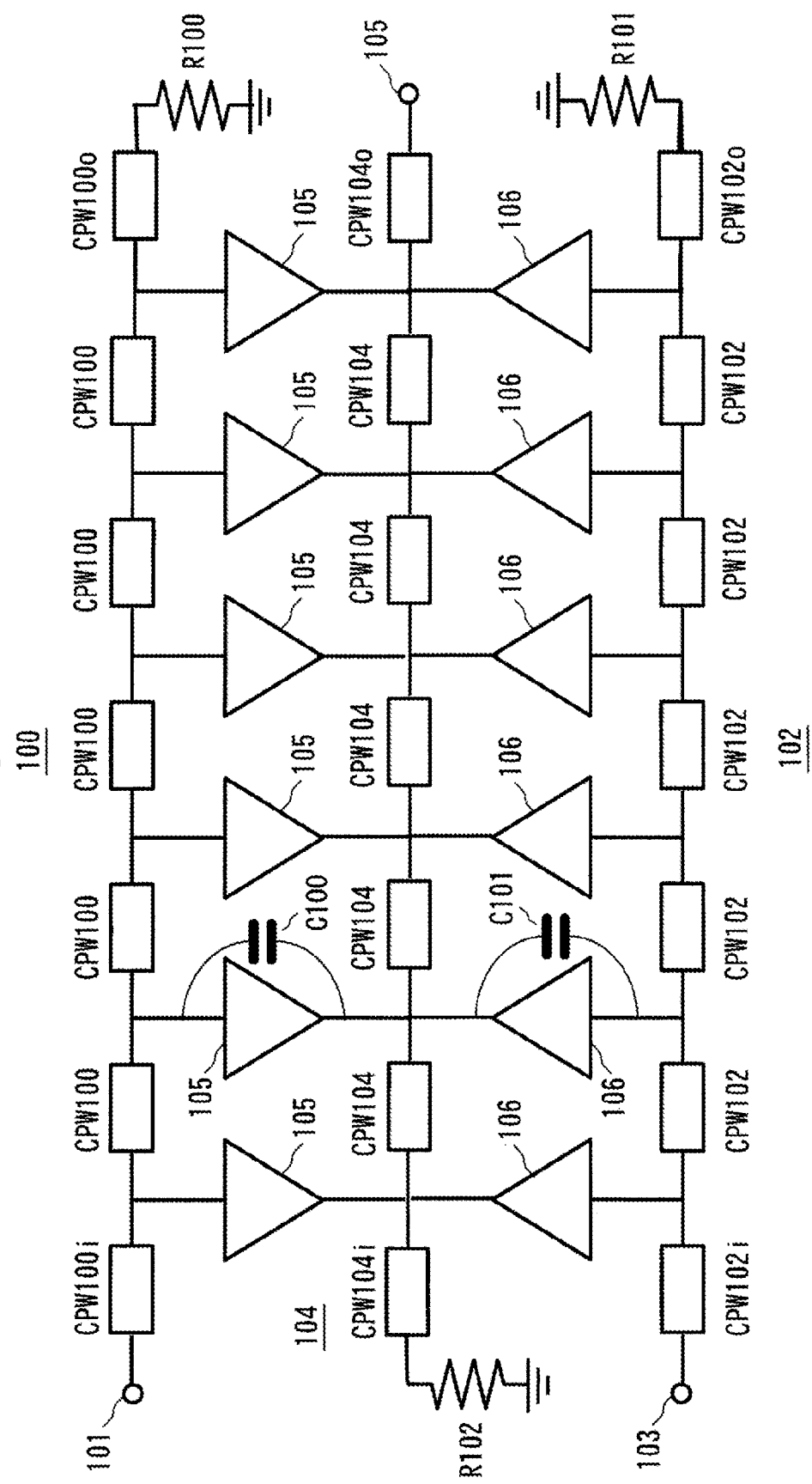
FIG. 10 is a diagram for explaining a problem in the conventional distributed active multiplexer.

FIG. 2 shows simulation results of the transmission characteristics of a conventional distributed active multiplexer and the multiplexer 4 of the present embodiment. In FIG. 2, 200 indicates a simulation result of the conventional distributed active multiplexer illustrated in FIGS. 9, and 201 indicates a simulation result of the multiplexer 4 of the present embodiment. The bandwidth of the conventional distributed active multiplexer is 188 GHz, while the bandwidth of the multiplexer 4 of the present embodiment is 250 GHz. This shows the effect of widening the bandwidth by the present embodiment.

Figure 3:
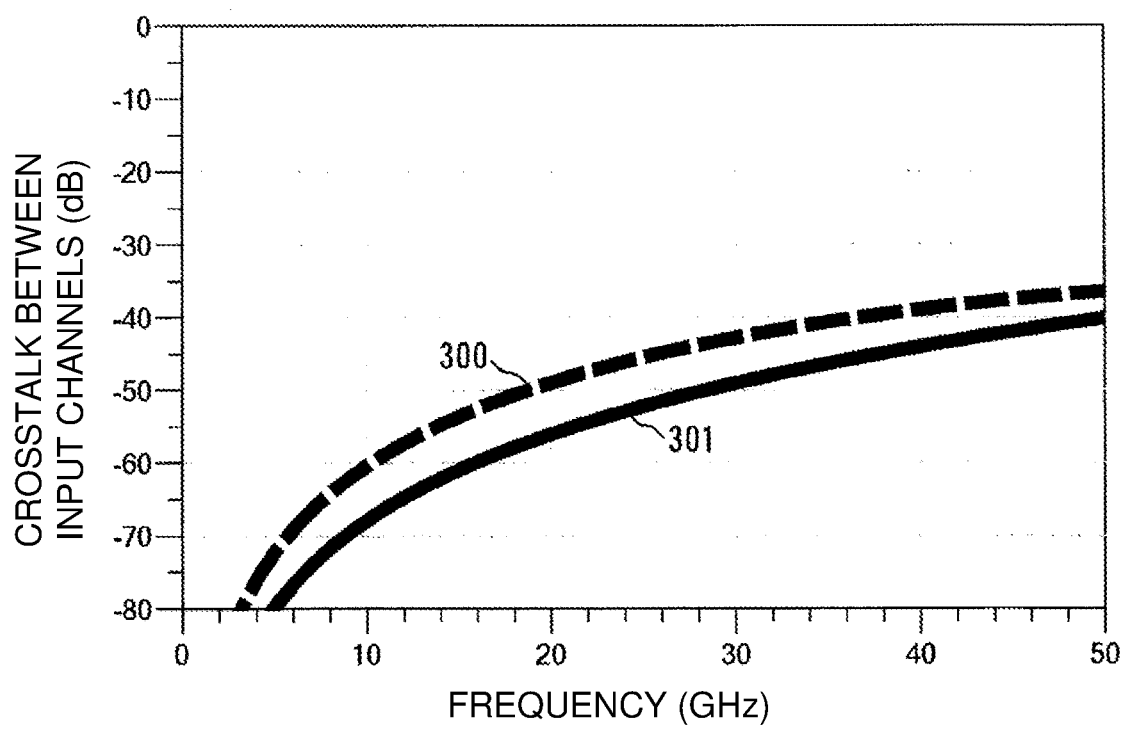
FIG. 3 is a graph showing simulation results of characteristics of crosstalk between the input channels of a conventional distributed active multiplexer and the multiplexer according to the first embodiment of the present invention.

FIG. 3 shows simulation results of characteristics of crosstalk between the input channels of a conventional distributed active multiplexer and the multiplexer 4 of the present embodiment. In FIG. 3, 300 indicates a simulation result of the conventional distributed active multiplexer illustrated in FIG. 9, and 301 indicates a simulation result of the multiplexer 4 of the present embodiment. It can be seen that the present embodiment reduces the signal crosstalk between channel 1 and channel 2 by approximately 5 dB, compared to the conventional one.

Second Embodiment

Next, a second embodiment of the present invention will be described. The characteristics of the multiplexer 4 shown as the first embodiment in FIGS. 2 and 3 are simulation results of one using a passive multiplexer 3a composed of ideal resistor devices. However, actual resistor devices have parasitic capacitance components and parasitic inductance components. These parasitic capacitance components and parasitic inductance components cause impedance mismatch at high frequencies, resulting in bandwidth deterioration.

Figure 4:
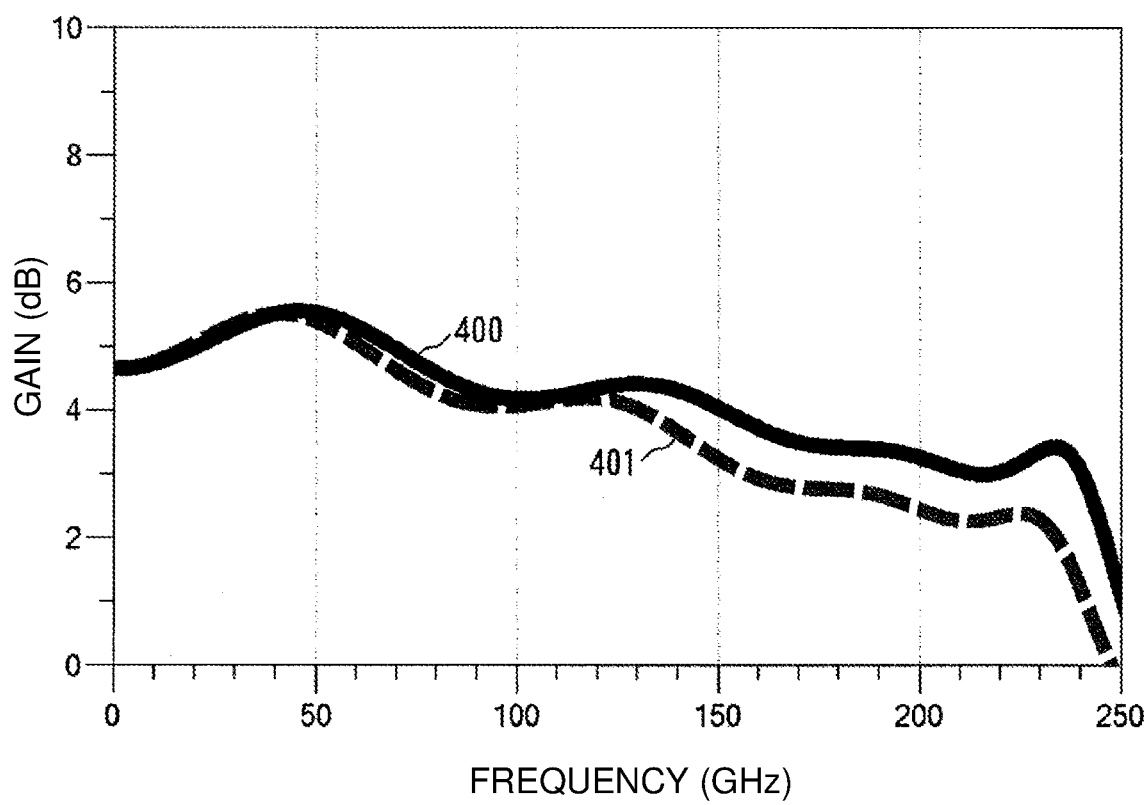
FIG. 4 is a graph showing simulation results of transmission characteristics of the multiplexer according to the first embodiment of the present invention for the case in which the resistors in the passive multiplexer do not have parasitic components and for the case in which they do.

FIG. 4 shows simulation results of the transmission characteristics of the multiplexer 4 for the case in which the resistors R30 to R32 of the passive multiplexer 3a do not have parasitic components and for the case in which they do. In FIG. 4, 400 indicates a simulation result for the case in which the resistors R30 to R32 do not have parasitic components, and 401 indicates a simulation result for the case in which the resistors R30 to R32 have parasitic components. FIG. 4 shows that the parasitic components of the resistors R30 to R32 degrade the bandwidth of the multiplexer 4.

Figure 5:
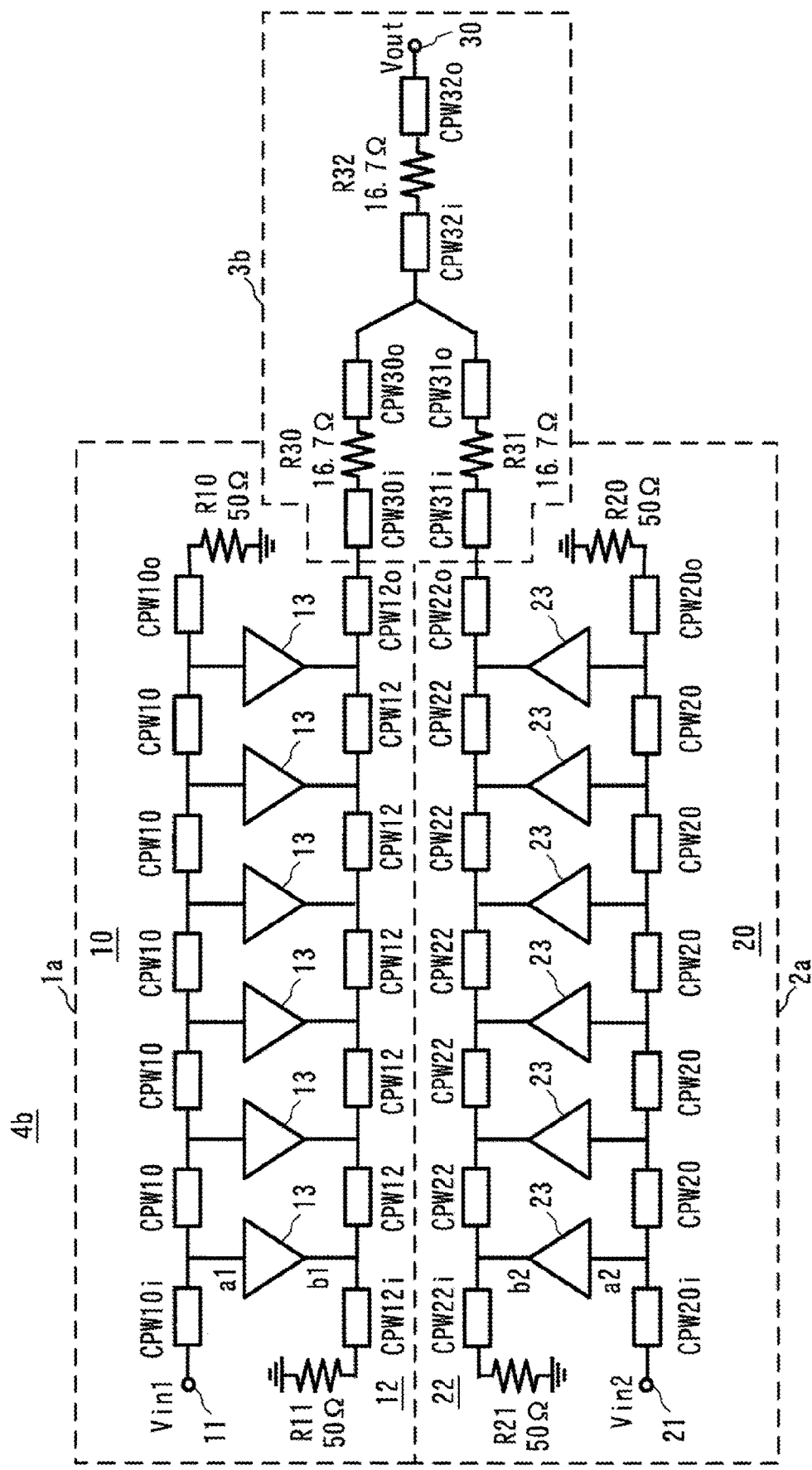
FIG. 5 is a circuit diagram illustrating the configuration of a multiplexer according to a second embodiment of the present invention.

FIG. 5 is a circuit diagram illustrating the configuration of a multiplexer according to the present embodiment. The multiplexer 4b of the present embodiment includes two distributed amplifiers 1a and 2a and a passive multiplexer 3b.

The configurations of the distributed amplifiers 1a and 2a are as described in the first embodiment.

The passive multiplexer 3b of the present embodiment includes resistors R30 to R32, a transmission line CPW30i inserted between the resistor R30 and the terminal end of the output transmission line 12 of the distributed amplifier 1a (the output terminal of the distributed amplifier 1a), a transmission line CPW300 inserted between the resistor R30 and the resistor R32, a transmission line CPW31i inserted between the resistor R31 and the terminal end of the output transmission line 22 of the distributed amplifier 2a (the output terminal of the distributed amplifier 2a), a transmission line CPW310 inserted between the resistor R31 and the resistor R32, a transmission line CPW32i inserted between the transmission lines CPW300 and 310 and the resistor R32, and a transmission line CPW320 inserted between the resistor R32 and the signal output terminal 30.

The present embodiment prevents bandwidth deterioration by the configuration of the passive multiplexer 3a as illustrated in FIG. 5 in which the transmission lines CPW30i, CPW300, CPW31i, CPW310, CPW32i, and CPW320 absorb the parasitic components of the resistors R30 to R32, achieving the multiplexer 4b having a wide bandwidth.

In the design of the present embodiment, the characteristic impedances of the transmission lines CPW30i, CPW300, CPW31i, and CPW310 need to be higher than the characteristic impedances of the transmission lines CPW32i and CPW320. To achieve a bandwidth higher than or equal to 200 GHz, the transmission lines CPW30i and CPW300 are designed such that the characteristic impedance of the resistor R30 having parasitic components and the transmission lines CPW30i and CPW300 is within a range of 70Ω±20%. To achieve a bandwidth higher than or equal to 200 GHz, the transmission lines CPW31i and CPW310 are designed such that the characteristic impedance of the resistor R31 having parasitic components and the transmission lines CPW31i and CPW310 is within a range of 70Ω±20%. In addition, to achieve a bandwidth higher than or equal to 200 GHz, the transmission lines CPW32i and CPW320 are designed such that the characteristic impedance of the resistor R32 having parasitic components and the transmission lines CPW32i and CPW320 is within a range of 50Ω±20%.

Figure 6:
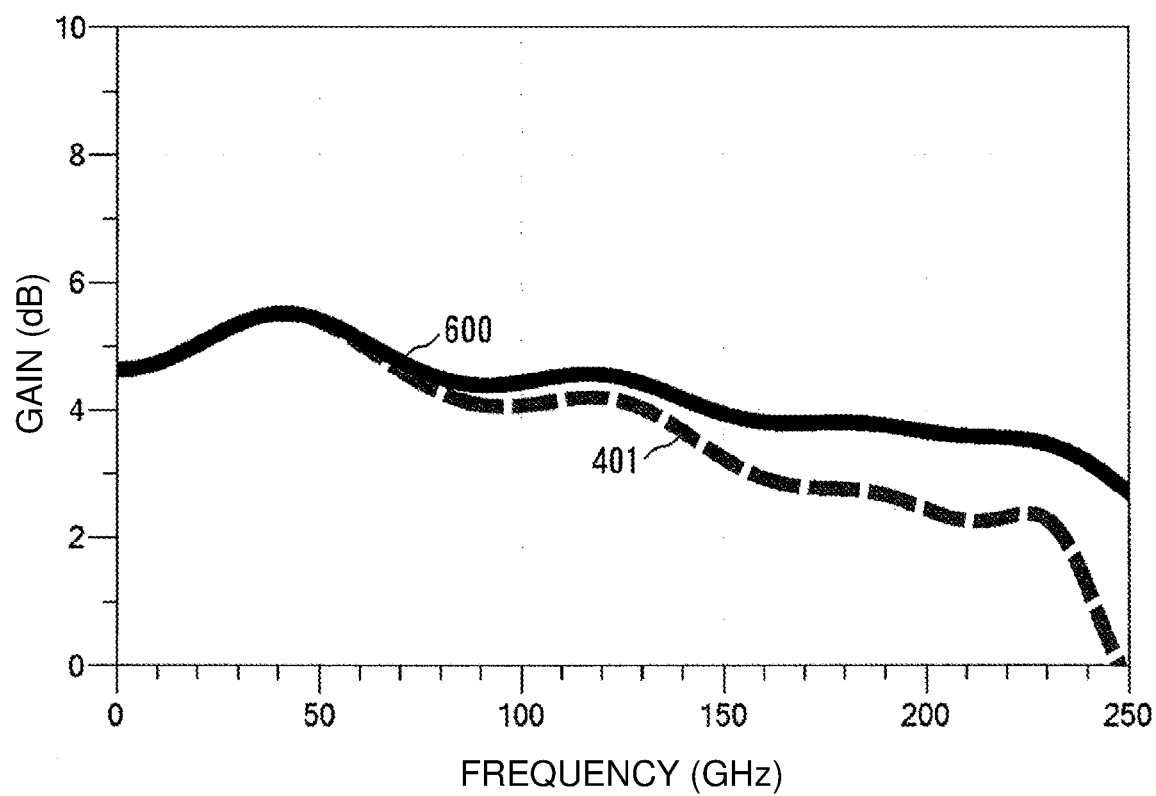
FIG. 6 is a graph showing simulation results of the transmission characteristics of the multiplexers according to the first and second embodiments of the present invention.

FIG. 6 shows a simulation result of the transmission characteristics of the multiplexer 4 for the case in which the resistors R30 to R32 of the passive multiplexer 3a have parasitic components in the first embodiment and a simulation result of the transmission characteristics of the multiplexer 4b of the present embodiment. In FIG. 6, 401 indicates a simulation result for the case in which the resistors R30 to R32 have parasitic components in the first embodiment, and 600 indicates a simulation result of the present embodiment. It can be seen that the configuration of the present embodiment prevents the bandwidth deterioration due to the parasitic components of the resistors R30 to R32 and enables a wider bandwidth.

Third Embodiment

Figure 7:
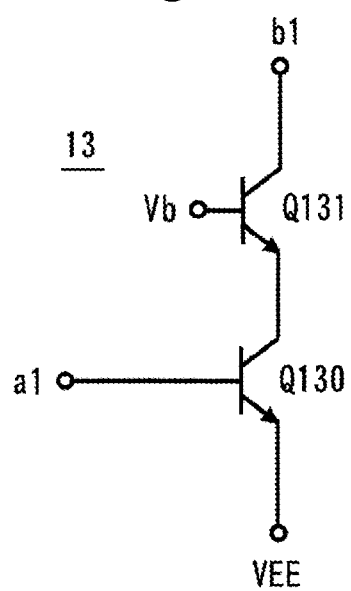
FIG. 7 is a circuit diagram illustrating the configuration of a unit amplifier in the multiplexers according to the first and second embodiments of the present invention.

Next, a third embodiment of the present invention will be described. The present embodiment relates to the configuration example of the unit amplifiers 13 and 23 of the first and second embodiments. FIG. 7 is a circuit diagram illustrating the configuration of a unit amplifier 13 of the distributed amplifier 1a, and FIG. 8 is a circuit diagram illustrating the configuration of a unit amplifier 23 of the distributed amplifier 2a.

As illustrated in FIG. 7, the unit amplifier 13 includes an input transistor Q130 having a base terminal connected to the transmission line CPW10 and an emitter terminal connected to a power supply voltage VEE, and an output transistor Q131 having a base terminal connected to a bias voltage Vb, a collector terminal connected to the transmission line CPW12, and an emitter terminal connected to the collector terminal of the input transistor Q130.

Figure 8:
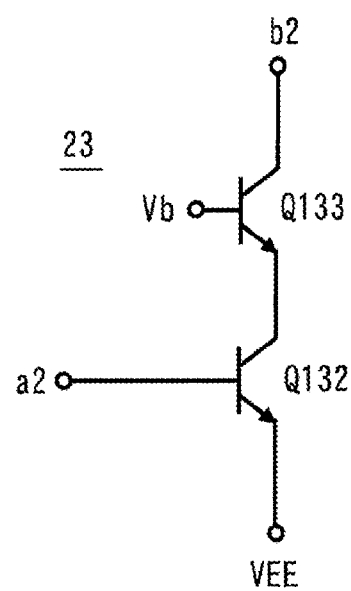
FIG. 8 is a circuit diagram illustrating the configuration of a unit amplifier in the multiplexers according to the first and second embodiments of the present invention.

As illustrated in FIG. 8, the unit amplifier 23 includes an input transistor Q132 having a base terminal connected to the transmission line CPW20 and an emitter terminal connected to the power supply voltage VEE, and an output transistor Q133 having a base terminal connected to the bias voltage Vb, a collector terminal connected to the transmission line CPW22, and an emitter terminal connected to the collector terminal of the input transistor Q132.

As described above, since the configurations of the unit amplifiers 13 and 23 have cascode connection as illustrated in FIGS. 7 and 8, it is possible to reduce mirror capacitance and enables a wider bandwidth and improvement in the isolation between the input channels.

INDUSTRIAL APPLICABILITY

The present invention is applicable to circuit techniques for handling high frequency electrical signals.

REFERENCE SIGNS LIST 1a, 2a Distributed amplifier
3a, 3b Passive multiplexer 4, 4b Multiplexer
10, 20 Input transmission line
11, 21 Signal input terminal
12, 22 Output transmission line
13, 23 Unit amplifier
30 Signal output terminal
CPW10, CPW10i, CPW100, CPW12, CPW12i, CPW120, CPW20, CPW20i, CPW200, CPW22, CPW22i, CPW220, CPW30i, CPW300, CPW31i, CPW310, CPW32i, CPW320 Transmission line
Q130 to Q132 Transistor
R10, R11, R20, R21, R30 to R32 Resistor

The invention claimed is:

1. A multiplexer comprising:
a first distributed amplifier with an impedance matched to 50Ω, the first distributed amplifier configured to receive a first signal and output a first amplified signal;
a second distributed amplifier with an impedance matched to 50Ω, the second distributed amplifier configured to receive a second signal and output a second amplified signal; and
a passive multiplexer configured to multiplex the first amplified signal and the second amplified signal, and output a multiplexed signal to a signal output terminal, the passive multiplexer including:
a first resistor having a first end to receive the first amplified signal,
a second resistor having a first end to receive the second amplified signal, and
a third resistor having a first end connected to second ends of the first and second resistors and a second end connected to the signal output terminal.

2. The multiplexer according to claim 1, wherein the passive multiplexer further comprises:
a first transmission line configured to transmit the first amplified signal to the first end of the first resistor,
a second transmission line inserted between the second end of the first resistor and the first end of the third resistor,
a third transmission line configured to transmit the second amplified signal to the first end of the second resistor,
a fourth transmission line inserted between the second end of the second resistor and the first end of the third resistor,
a fifth transmission line inserted between the second and fourth transmission lines and the first end of the third resistor, and
a sixth transmission line inserted between the second end of the third resistor and the signal output terminal.

3. The multiplexer according to claim 2, wherein:
resistance values of the first, second, and third resistors are 16.7Ω,
a characteristic impedance of the first resistor and the first and second transmission lines is within a range of 70Ω±20%,
a characteristic impedance of the second resistor and the third and fourth transmission lines is within a range of 70Ω±20%, and
a characteristic impedance of the third resistor and the fifth and sixth transmission lines is within a range of 50Ω±20%.

4. The multiplexer according to claim 1, wherein the first distributed amplifier comprises:
a first input transmission line having an input end to receive the first signal,
a first output transmission line having a terminal end to output the first amplified signal,
a first input termination resistor having a first end connected to a terminal end of the first input transmission line and a second end connected to a ground,
a first output termination resistor having a first end connected to an input end of the first output transmission line and a second end connected to the ground, and
a plurality of first unit amplifiers arranged along the first input transmission line and the first output transmission line, each of the plurality of first unit amplifiers having an input terminal connected to the first input transmission line and an output terminal connected to the first output transmission line.

5. The multiplexer according to claim 4, wherein the second distributed amplifier comprises:
a second input transmission line having an input end to receive the second signal,
a second output transmission line having a terminal end to output the second amplified signal,
a second input termination resistor having a first end connected to a terminal end of the second input transmission line and a second end connected to the ground,
a second output termination resistor having a first end connected to an input end of the second output transmission line and a second end connected to the ground, and
a plurality of second unit amplifiers arranged along the second input transmission line and the second output transmission line, each of the plurality of second unit amplifiers having an input terminal connected to the second input transmission line and an output terminal connected to the second output transmission line.

6. The multiplexer according to claim 5, wherein each of the first unit amplifiers comprise:
a first transistor having a base terminal connected to the first input transmission line and an emitter terminal connected to a power supply voltage, and
a second transistor having a base terminal connected to a bias voltage, a collector terminal connected to the first output transmission line, and an emitter terminal connected to the collector terminal of the first transistor.

7. The multiplexer according to claim 6, wherein each of the second unit amplifiers comprise:
a third transistor having a base terminal connected to the second input transmission line and an emitter terminal connected to the power supply voltage, and
a fourth transistor having a base terminal connected to the bias voltage, a collector terminal connected to the second output transmission line, and an emitter terminal connected to the collector terminal of the third transistor.

8. A multiplexer comprising:
a first distributed amplifier configured to receive a first signal and output a first amplified signal, the first distributed amplifier having an impedance matched to 50Ω, wherein the first distributed amplifier comprises:
a first input transmission line having an input end configured to receive the first signal,
a first output transmission line having a terminal end the first amplified signal,
a first input termination resistor having a first end connected to a terminal end of the first input transmission line and a second end connected to a ground,
a first output termination resistor having a first end connected to an input end of the first output transmission line and a second end connected to the ground, and a plurality of first unit amplifiers arranged along the first input transmission line and the first output transmission line, each of the plurality of first unit amplifiers having an input terminal connected to the first input transmission line and an output terminal connected to the first output transmission line;

a second distributed amplifier configured to receive a second signal and output a second amplified signal, the second distributed amplifier having an impedance matched to 50Ω, wherein the second distributed amplifier comprises:

a second input transmission line having an input end configured to receive input of the second signal, a second output transmission line having a terminal end configured to output the second amplified signal, a second input termination resistor having a first end connected to a terminal end of the second input transmission line and a second end connected to the ground, a second output termination resistor having a first end connected to an input end of the second output transmission line and a second end connected to the ground, and a plurality of second unit amplifiers arranged along the second input transmission line and the second output transmission line, each of the second unit amplifiers having an input terminal connected to the second input transmission line and an output terminal connected to the second output transmission line; and a passive multiplexer configured to multiplex the first amplified signal and the second amplified signal, the passive multiplexer including:

a first resistor having a first end connected to an output of the first distributed amplifier, a second resistor having a first end connected to an output of the second distributed amplifier, and a third resistor having a first end connected to second ends of the first and second resistors and a second end connected to a signal output terminal.

9. The multiplexer according to claim 8, wherein the passive multiplexer further comprises:

a first transmission line between the output of the first distributed amplifier and the first end of the first resistor, a second transmission line between the second end of the first resistor and the first end of the third resistor, a third transmission line between the output of the second distributed amplifier and the first end of the second resistor, a fourth transmission line between the second end of the second resistor and the first end of the third resistor, a fifth transmission line between the second and fourth transmission lines and the first end of the third resistor, and a sixth transmission line between the second end of the third resistor and the signal output terminal.

10. The multiplexer according to claim 9, wherein:

the resistance values of the first, second, and third resistors being 16.7Ω, a characteristic impedance of the first resistor and the first and second transmission lines is within a range of 70Ω±20%, a characteristic impedance of the second resistor and the third and fourth transmission lines is within a range of 70Ω±20%, and a characteristic impedance of the third resistor and the fifth and sixth transmission lines is within a range of 50Ω±20%.

11. The multiplexer according to claim 8, wherein each of the plurality of first unit amplifiers comprise:

a first transistor having a base terminal connected to the first input transmission line and an emitter terminal connected to a power supply voltage, and a second transistor having a base terminal connected to a bias voltage, a collector terminal connected to the first output transmission line, and an emitter terminal connected to the collector terminal of the first transistor.

12. The multiplexer according to claim 11, wherein each of the plurality of second unit amplifiers comprise:

a third transistor having a base terminal connected to the second input transmission line and an emitter terminal connected to the power supply voltage, and a fourth transistor having a base terminal connected to the bias voltage, a collector terminal connected to the second output transmission line, and an emitter terminal connected to the collector terminal of the third transistor.

* * * * *